(12) United States Patent
Hasegawa

(10) Patent No.: US 7,079,362 B2
(45) Date of Patent: Jul. 18, 2006

(54) GIANT MAGNETORESISTIVE ELEMENT

(75) Inventor: Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 363 days.

(21) Appl. No.: 10/635,596

(22) Filed: Aug. 6, 2003

(65) Prior Publication Data

US 2004/0047088 A1 Mar. 11, 2004

(30) Foreign Application Priority Data

Aug. 19, 2002 (JP) ............... 2002-238319

(51) Int. Cl.
*G11B 5/39* (2006.01)
*G11B 5/127* (2006.01)

(52) U.S. Cl. ............................. 360/324.12

(58) Field of Classification Search ........ 360/324, 360/324.1, 324.11, 324.12
See application file for complete search history.

(56) References Cited

U.S. PATENT DOCUMENTS

| | | | |
|---|---|---|---|
| 6,030,753 A | 2/2000 | Lin | |
| 6,430,015 B1* | 8/2002 | Ju et al. | 360/327.32 |
| 6,857,180 B1* | 2/2005 | Horng et al. | 29/603.14 |
| 2001/0028540 A1 | 10/2001 | Sakaguci et al. | |
| 2001/0033466 A1 | 10/2001 | Ooshima et al. | |
| 2002/0024781 A1 | 2/2002 | Ooshima et al. | |
| 2002/0069511 A1* | 6/2002 | Hasegawa et al. | 29/603.14 |
| 2003/0156361 A1* | 8/2003 | Li et al. | 360/324.12 |
| 2003/0179514 A1* | 9/2003 | Horng et al. | 360/324.12 |
| 2004/0075959 A1* | 4/2004 | Gill | 360/324.12 |

FOREIGN PATENT DOCUMENTS

| | | | |
|---|---|---|---|
| JP | 2001076323 | * | 3/2001 |
| JP | 2001291915 | * | 10/2001 |

\* cited by examiner

*Primary Examiner*—William J Klimowicz
(74) *Attorney, Agent, or Firm*—Brinks Hofer Gilson & Lione

(57) ABSTRACT

A giant magnetoresistive (GMR) element includes a first antiferromagnetic layer, a pinned magnetic layer having a magnetization direction pinned by the first antiferromagnetic layer, a nonmagnetic material layer, a free magnetic layer having a magnetization direction with a central portion changing with an external magnetic field, a nonmagnetic layer, ferromagnetic layers formed on both sides of the nonmagnetic layer, and second antiferromagnetic layers for aligning the magnetization direction of the ferromagnetic layers perpendicular to that of the pinned magnetic layer. The magnetization directions of the free magnetic and ferromagnetic layers are antiparallel to each other. At least the free magnetic layer, the nonmagnetic layers and the ferromagnetic layers have continuous surfaces α at both end surfaces in the track width direction. First electrode layers are provided in contact with the continuous surfaces α, and second electrode layers are provided on the first electrode layers and the second antiferromagnetic layers.

26 Claims, 11 Drawing Sheets

GIANT MAGNETORESISTIVE ELEMENT

BACKGROUND OF THE INVENTION

1. Field of the Invention

The present invention relates to a giant magnetoresistive element used for a hard disk device, a magnetic sensor, and the like, and a method of manufacturing the same.

2. Description of the Related Art

In a giant magnetoresistive element (GMR) used for a hard disk device, a magnetic sensor, and the like, an improvement in output sensitivity and narrowing of a track have recently been advanced with increases in the recording density.

In order to improve the output sensitivity, a magnetic moment (areal moment) per unit area of a free magnetic layer is conventionally decreased by thinning the free magnetic layer to facilitate magnetization rotation of the magnetic moment. However, with the thin free magnetic layer, Barkhausen noise, thermal fluctuation noise, and the like are increased to cause the problem that a SN ratio cannot be increased even by increasing the output sensitivity. Also, a hard bias system using a permanent magnet film is conventionally used for the free magnetic layer. However, in the hard bias system, magnetization is strongly fixed at both side ends of the free magnetic layer adjacent to the permanent magnet film to produce dead zones, thereby causing the probability that the entire track region becomes a dead zone when narrowing of the track is advanced. Therefore, it is predicted that the hard bias system using the permanent magnet film is difficult to comply with a higher recording density.

Therefore, an exchange bias system has recently been proposed as the bias system for the free magnetic layer. As is generally known, a GMR element has a structure in which a first antiferromagnetic layer, a pinned magnetic layer, a nonmagnetic material layer and a free magnetic layer are laminated in turn. In the use of the exchange bias system, second antiferromagnetic layers and electrode layers are further formed on both sides of the free magnetic layer so that the track width of the GMR element is controlled by the distance between the second antiferromagnetic layers in the track width direction. In the use of the exchange bias system, no dead zone occurs, and thus output sensitivity can be possibly secured even with advances in track narrowing.

However, in the free magnetic layer, an exchange interaction acts between adjacent spins to orient the adjacent spins in parallel directions, and thus a distance corresponding to the strength of the exchange interaction between the adjacent spins is required for rotating the spins by an angle according to the strength of an external magnetic field. The strength of the exchange interaction can be represented by an exchange stiffness constant (exchange interaction constant). As the exchange stiffness constant increases, a spin direction cannot be rapidly changed to increase a distance required for spin rotation. When the distance required for spin rotation is increased, magnetization fixing at the ends of the track width region is strongly transmitted to the central portion, thereby decreasing the output sensitivity. This tendency becomes remarkable as the track width dimension decreases, and thus the output sensitivity cannot be easily secured even by using the exchange bias system. As a possible countermeasure against this, the free magnetic layer is made of a material having a small exchange stiffness constant. However, the use of the material having a small exchange stiffness constant undesirably decreases the Curie temperature. Also, the selection of the material has a limitation.

Furthermore, the use of the exchange bias system has the following problem.

Since a sensing current flows in the free magnetic layer through the antiferromagnetic layers having extremely higher resistivity than that of the electrode layers, the element resistance is increased. When the element resistance is increased, impedance is also increased to easily produce high-frequency noise, thereby failing to increase the SN ratio even with the improved output sensitivity.

SUMMARY OF THE INVENTION

The present invention has been achieved in consideration of the problem of the use of a conventional exchange bias system, and it is an object of the present invention to provide a giant magnetoresistive element capable of securing high output sensitivity even with advances in track narrowing, and a method of manufacturing the same. Another object of the present invention is to provide a giant magnetoresistive element capable of decreasing the element resistance, and a method of manufacturing the same.

The present invention has been achieved with attention to the point that output sensitivity can be improved by using a demagnetizing field produced in a free magnetic layer in the track width direction thereof, and the point that the element resistance can be decreased by supplying a sensing current without passing through an antiferromagnetic layer.

A giant magnetoresistive element of the present invention comprises a first antiferromagnetic layer, a pinned magnetic layer formed on the first antiferromagnetic layer so that the magnetization direction is pinned by an exchange coupling magnetic field with the first antiferromagnetic layer, a nonmagnetic material layer formed on the pinned magnetic layer, a free magnetic layer formed on the nonmagnetic material layer so that the magnetization direction of a central portion changes with an external magnetic field, nonmagnetic layers formed on both side portions of the free magnetic layer in the track width direction, ferromagnetic layers formed on the respective nonmagnetic layers, and second antiferromagnetic layers formed on the respective ferromagnetic layers to align the magnetization direction of each ferromagnetic layer in a direction perpendicular to the magnetization direction of the pinned magnetic layer, wherein at least the free magnetic layer, the nonmagnetic layers and the ferromagnetic layers have continuous end surfaces at both sides in the track width direction.

In the above-described construction, magnetostatic coupling occurs between the free magnetic layer and the ferromagnetic layers at both end surfaces thereof, and thus a demagnetizing field applied in the free magnetic layer in the track width direction thereof is weakened by the magnetostatic coupling. Namely, even if the demagnetizing field is increased by narrowing the track, disturbance of magnetization of each of the free magnetic layer and the ferromagnetic layers can be sufficiently suppressed to secure high stability of a reproduction waveform. Also, the magnetization directions of both side portions of the free magnetic layer and the ferromagnetic layers are strongly pinned by the second antiferromagnetic layers. Therefore, even if the demagnetizing field is increased by narrowing the track, there is no probability of side reading.

The ratio FW/FL of the dimension FW of the free magnetic layer in the track width direction to the dimension FL of the ferromagnetic layers in the track width direction is preferably 1.1 to 2.0. With a FW/FL ratio within this range, magnetization of a track width region (a central portion of the free magnetic layer) easily rotates with an external magnetic field to improve output sensitivity. The dimension FL of the free magnetic layers in the track width direction is a total dimension FL1+FL2 of the dimensions of FL1 and FL2 of the respective ferromagnetic layers in the track width direction.

The above-described giant magnetoresistive element preferably further comprises electrode layers formed in contact with the upper surfaces of the respective second antiferromagnetic layers and contact with both end surfaces of the layers ranging from the respective antiferromagnetic layers to the pinned magnetic layer in the track width direction. Each of the electrode layers comprises a first electrode layer formed in contact with the end surfaces of the layers ranging from the pinned magnetic layer to each second antiferromagnetic layer at each side in the track width direction, and a second electrode layer formed on the first electrode layer and each second antiferromagnetic layer. In this construction, a sensing current can be supplied without passing through the second antiferromagnetic layers having extremely higher resistivity than that of a conductive material for forming the electrode layers. Therefore, the element resistance can be sufficiently suppressed to suppress the occurrence of high-frequency noise, thereby improving the SN ratio.

Each of the second antiferromagnetic layers may comprise a lower antiferromagnetic layer laminated on each ferromagnetic layer, and an upper antiferromagnetic layer. In this case, the lower antiferromagnetic layers are preferably 20 Å to 50 Å in thickness. With the lower antiferromagnetic layers each having a thickness in this range, the lower antiferromagnetic layers do not assume antiferromagnetic properties in a stage in which only the lower antiferromagnetic layers are formed (the upper antiferromagnetic layers are not formed). Therefore, even in a first heat treatment for pinning the magnetization direction of the pinned magnetic layer, no or a weak exchange coupling magnetic field occurs between each of the lower antiferromagnetic layers and the ferromagnetic layer. On the other hand, in a stage in which the upper antiferromagnetic layers are formed on the lower antiferromagnetic layers, a heat treatment produces great exchange coupling magnetic fields between the ferromagnetic layers and the lower antiferromagnetic layers. Therefore, the total thickness of each lower antiferromagnetic layer and upper antiferromagnetic layer is preferably 80 Å to 300 Å.

A nonmagnetic protective layer may be interposed between each lower antiferromagnetic layer and upper antiferromagnetic layer, or a constituent element of the nonmagnetic protective layer may be mixed in the lower antiferromagnetic or upper antiferromagnetic layers. However, the thickness of each nonmagnetic protective layer is preferably 3 Å or less so that the lower antiferromagnetic and upper antiferromagnetic layers can function as an antiferromagnetic layer as a unit. The constituent element of the nonmagnetic protective layers is preferably at least one of Ru, Rh, Pd, Ir, Os, Re, Cr, Cu, Pt, and Au. The nonmagnetic protective layers function as antioxidation films for protecting the surfaces of the lower antiferromagnetic layers from oxidation in the manufacturing process.

In a first aspect of the present invention, a method of manufacturing a giant magnetoresistive element comprises (a) a step of laminating a first antiferromagnetic layer, a pinned magnetic layer, a nonmagnetic material layer, a free magnetic layer and a nonmagnetic layer in order on a substrate; (b) a step of performing a first heat treatment to pin the magnetization direction of the pinned magnetic layer by an exchange coupling magnetic field produced between the first antiferromagnetic layer and the pinned magnetic layer; (c) a step of cleaning the surface of the nonmagnetic layer by low-energy ion milling; (d) a step of laminating a ferromagnetic layer and a second antiferromagnetic layer in order on the nonmagnetic layer; (e) a step of forming a resist layer on a region of the second antiferromagnetic layer corresponding to a track width region; (f) a step of removing exposed portions of at least the second antiferromagnetic layer, the ferromagnetic layer, the nonmagnetic layer and the free magnetic layer, which are partially exposed from both sides of the resist layer in the track width direction; (g) a step of removing the resist layer and forming an electrode layer on regions of the second antiferromagnetic layer out of the track width region; (h) a step of partially removing the second antiferromagnetic layer, the ferromagnetic layer and the nonmagnetic layer within the track width region by etching using the electrode layer as a mask; and (i) a step of performing a second heat treatment to pin the magnetic direction of the ferromagnetic layer in a direction perpendicular to the magnetization direction of the pinned magnetic layer by exchange coupling produced between the second antiferromagnetic layer and the ferromagnetic layer, wherein in the steps (a) and (d), the free magnetic layer and the ferromagnetic layer are formed so that the magnetic moment per unit area of the free magnetic layer is larger than that of the ferromagnetic layer, in the step (c), the nonmagnetic layer is removed by the low-energy ion milling to a thickness with which RKKY coupling energy produced between the free magnetic layer and the ferromagnetic layer is a first peak or second peak value for antiparallel alignment, and in the step (f), the layers ranging from the second antiferromagnetic layer to the free magnetic layer are left to have continuous surfaces at both end surfaces in the track width direction.

In a second aspect of the present invention, a method of manufacturing a giant magnetoresistive element comprises (m) a step of laminating a first antiferromagnetic layer, a pinned magnetic layer, a nonmagnetic material layer, a free magnetic layer and a nonmagnetic layer, a ferromagnetic layer, a lower antiferromagnetic layer and a nonmagnetic protective layer in order on a substrate; (n) a step of performing a first heat treatment to pin the magnetization direction of the pinned magnetic layer by an exchange coupling magnetic field produced between the first antiferromagnetic layer and the pinned magnetic layer; (o) a step of cleaning the surface of the nonmagnetic protective layer by low-energy ion milling; (p) a step of laminating an upper antiferromagnetic layer on the nonmagnetic protective layer; (r) a step of forming a resist layer on a region of the upper antiferromagnetic layer corresponding to a track width region; (s) a step of removing exposed portions of at least the upper antiferromagnetic layer, the nonmagnetic protective layer, the lower antiferromagnetic layer, the ferromagnetic layer, the nonmagnetic layer and the free magnetic layer, which are partially exposed from both sides of the resist layer in the track width direction; (t) a step of removing the resist layer and forming an electrode layer on regions of the upper antiferromagnetic layer out of the track width region; (u) a step of partially removing the upper antiferromagnetic layer, the nonmagnetic protective layer, the lower antiferromagnetic layer, the ferromagnetic layer and the nonmagnetic layer within the track width region by etching using the electrode layer as a mask; and (v) a step of performing a second heat treatment to pin the magnetization direction of the ferromagnetic layer in a direction perpendicular to the magnetization direction of the pinned magnetic layer by exchange coupling produced between the lower antiferromagnetic layer and the ferromagnetic layer, wherein in the step (m), the free magnetic layer and the ferromagnetic layer are formed so that the magnetic moment per unit area of the free magnetic layer is larger than that of the ferromagnetic layer, and the nonmagnetic layer is formed to a thickness with which RKKY coupling energy produced between the free magnetic layer and the ferromagnetic layer is a first peak or second peak value for antiparallel alignment, and in the step (s), the layers ranging from the upper antiferromagnetic layer to the free magnetic layer are left to have continuous surfaces at both end surfaces in the track width direction.

The ratio FW/FL of the dimension FW of the free magnetic layer in the track width direction to the dimension FL of the ferromagnetic layers in the same direction is preferably 1.1 to 2.0.

In each of the aspects of the present invention, the electrode layer may comprise a first electrode layer in contact with the end surfaces of the layers from the second antiferromagnetic layer to the pinned magnetic layer at each side in the track width direction, and a second electrode layer disposed on the first electrode layer and the second antiferromagnetic layer. Namely, in the first aspect, in place of the step (g), a step (j) of forming a first electrode layer in contact with the end surfaces of at least the layers ranging from the second antiferromagnetic layer to the pinned magnetic layer at each side in the track width direction, (k) a step of removing the resist layer, (l) a step of forming a second electrode layer on the first electrode layer and the second antiferromagnetic layer outside the track width region may be performed. In the second aspect, in place of the step (t), a step (w) of forming a first electrode layer in contact with the end surfaces of at least the layers ranging from the upper antiferromagnetic layer to the pinned magnetic layer at each side in the track width direction, (x) a step of removing the resist layer, (y) a step of forming a second electrode layer on the first electrode layer and the upper antiferromagnetic layer outside the track width region may be performed.

The lower antiferromagnetic layer is preferably deposited to a thickness of 20 Å to 50 Å. With a thickness within this range, the lower antiferromagnetic layer do not assume the antiferromagnetic properties in the stage in which only the lower antiferromagnetic layer is formed (the upper antiferromagnetic layer is not formed). Therefore, even in a first heat treatment for pinning the magnetization direction of the pinned magnetic layer, no or a weak exchange coupling magnetic field occurs between the lower antiferromagnetic layer and the ferromagnetic layer. On the other hand, in the stage in which the upper antiferromagnetic layer is formed on the lower antiferromagnetic layer, a heat treatment produces a great exchange coupling magnetic field between the ferromagnetic layer and the lower antiferromagnetic layer. Therefore, the total thickness of the lower antiferromagnetic layer and upper antiferromagnetic layer is preferably 80 Å to 300 Å.

The nonmagnetic protective layer is preferably deposited to a thickness of 3 Å to 10 Å so that oxidation of the lower antiferromagnetic layer can be prevented and the nonmagnetic protective layer can easily be removed. The nonmagnetic protective layer is preferably controlled to a thickness of 3 Å or less by low-energy ion milling. In this case, the lower and upper antiferromagnetic layers are coupled with each other through the nonmagnetic protective layer to function as an antiferromagnetic layer as a unit.

Each of the free magnetic layer and the ferromagnetic layer may comprise any one of a NiFe alloy, Co, a CoFe alloy, a CoNi alloy, and a CoFeNi alloy. The free magnetic layer and ferromagnetic layer are preferably made of the same magnetic material. When the free magnetic layer and ferromagnetic layer are made of the same magnetic material, the thickness of the ferromagnetic layer is made smaller than that of the free magnetic layer so that the magnetic moment per unit area of the free magnetic layer is larger than that of the ferromagnetic layer. When each of the free magnetic layer and ferromagnetic layer comprises a single layer, at least one of the free magnetic layer and ferromagnetic layer preferably comprises a CoFeNi alloy. Furthermore, when each of the free magnetic layer and ferromagnetic layer comprises a plurality of layers, the free magnetic layer preferably comprises a laminate of a NiFe alloy layer and a CoFe alloy layer, and the ferromagnetic layer preferably comprises a laminate of a CoFe alloy layer and a NiFe alloy layer.

The nonmagnetic layer is preferably composed of at least one of Ru, Rh, Pd, Ir, Os, Re, Cr, Cu, Pt. and Au, and particularly the nonmagnetic layer is preferably composed of Ru or Cu.

The first antiferromagnetic and/or second antiferromagnetic layer preferably comprises a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy. With the first antiferromagnetic layer and/or second antiferromagnetic comprising any one of these alloys, a large exchange coupling magnetic field can be produced between the first antiferromagnetic layer and the pinned magnetic layer and/or the second antiferromagnetic layer and the ferromagnetic layer.

DESCRIPTION OF THE PREFERRED EMBODIMENTS

Figure 1:
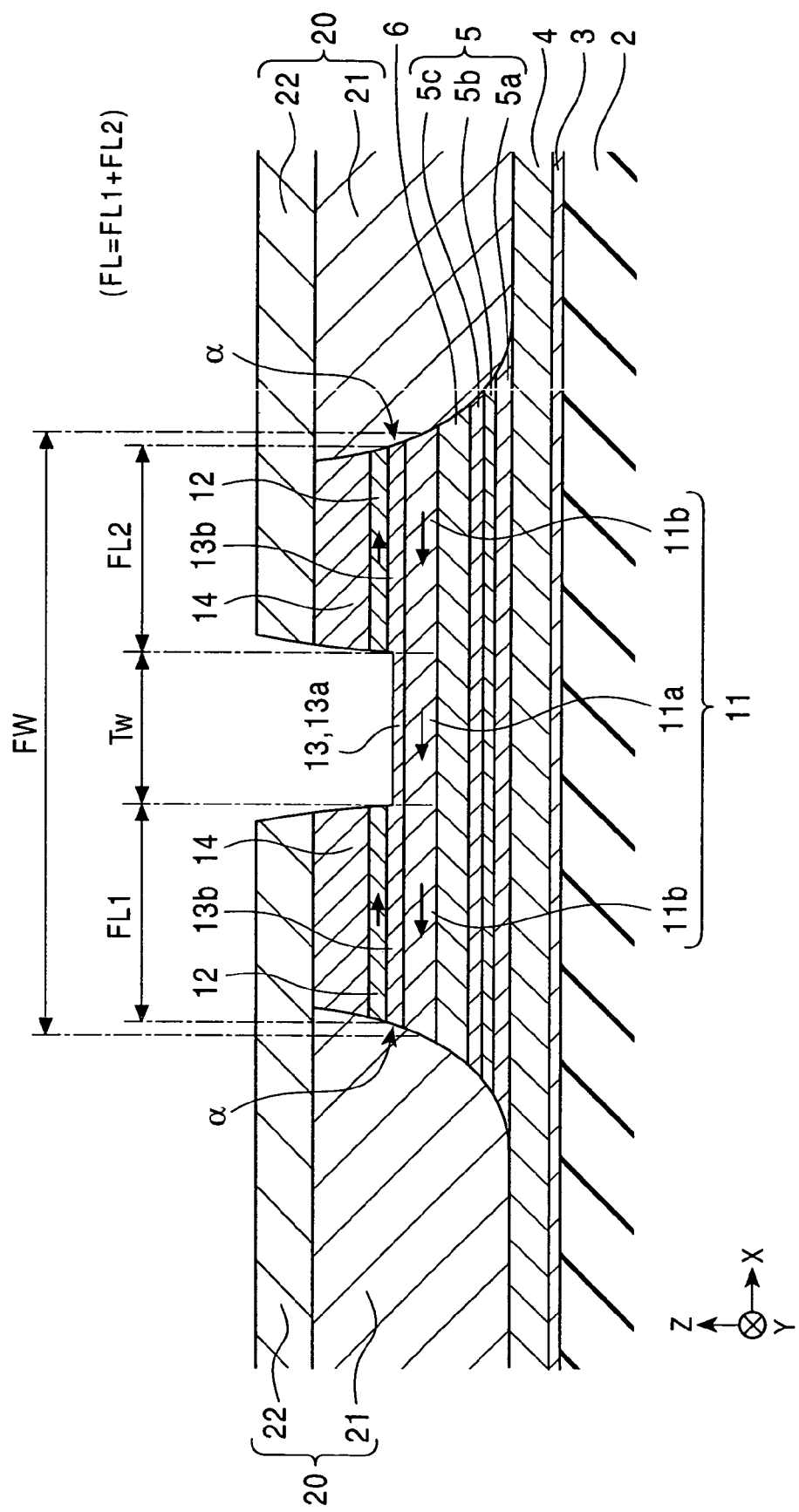
FIG. 1 is a partial sectional view showing the structure of a giant magnetoresistive element (GMR element) according to a first embodiment of the present invention, as viewed from a surface facing a recording medium.

The present invention will be described below with reference to the drawings. In each of the drawing, the X direction coincides with the track width direction, the Y direction coincides with the direction of a leakage magnetic field from a recording medium, and Z direction coincides with the movement direction of the recording medium and the lamination direction of layers constituting a giant magnetoresistive element.

FIG. 1 is a schematic sectional view showing the structure of a giant magnetoresistive (GMR) element 1 according to a first embodiment of the present invention, as viewed from a surface facing the recording medium. The GMR element 1 is used for, for example, a thin film magnetic head of a hard disk device, for detecting a leakage magnetic field from the recording medium by utilizing a GMR effect.

The GMR element 1 is formed on a lower gap layer 2 comprising an insulating material such as alumina ($Al_2O_3$) or the like. The GMR element 1 comprises a seed layer 3, a first antiferromagnetic layer 4, a pinned magnetic layer 5, a nonmagnetic material layer 6, a free magnetic layer 11, a nonmagnetic layer 13, ferromagnetic layers 12, second antiferromagnetic layers 14 and electrode layers 20, which are laminated in that order on the lower gap layer 2. The nonmagnetic layer 13, the ferromagnetic layers 12 and the second antiferromagnetic layers 14 are longitudinal bias layers for the free magnetic layer 11. Although not shown in the drawing, an undercoat layer composed of alumina, an underlying layer composed of Ta, a NiFe alloy or the like, and a lower shield layer composed of a magnetic material such as a NiFe alloy or the like may be formed below the lower gap layer 2 in that order from an alumina-titanium carbide substrate.

The seed layer 3 is an underlying layer for arranging crystal growth of each of the first antiferromagnetic layer 4 and the layers laminated thereon, and comprises a NiFe alloy, a NiCr alloy, a NiFeCr alloy, Cr, or the like. The underlying layer composed of Ta or the like may be formed between the seed layer 3 and the lower gap layer 2, or the underlying layer may be formed instead of the seed layer 3.

The first antiferromagnetic layer 4 produces a great exchange coupling magnetic field between the pinned magnetic layer 5 and the first antiferromagnetic layer 4 by a heat treatment so that the magnetization direction of the pinned magnetic layer 5 is pinned in the Y direction shown in the drawing. The first antiferromagnetic layer 4 comprises a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy. Although these alloys have a disordered face-centered cubic structure (fcc) immediately after deposition, the fcc structure is transformed to a CuAuI-type ordered face-centered tetragonal structure (fct) by a heat treatment. Therefore, when the first antiferromagnetic layer 4 is formed by using any one of the alloys, a great exchange coupling magnetic field can be produced between the first antiferromagnetic layer 4 and the pinned magnetic layer 5 by the heat treatment.

The pinned magnetic layer 5 has a laminated ferrimagnetic pinned structure comprising a first pinned magnetic layer 5a, a nonmagnetic intermediate layer 5b and a second pinned magnetic layer 5c. In this structure, magnetization of the first pinned magnetic layer 5a is pinned in the height direction by exchange coupling with the first antiferromagnetic layer 4, and magnetization of the second pinned magnetic layer 5c is pinned in a direction at 180° (antiparallel) with respect to the magnetization direction of the first pinned magnetic layer 5a through the nonmagnetic intermediate layer 5b. With the pinned magnetic layer 5 having the laminated ferrimagnetic pinned structure, the magnetization direction of the pinned magnetic layer 5 can be stably pinned by a synergy effect of antiparallel coupling between the first and second pinned magnetic layers 5a and 5c through the nonmagnetic intermediate layer 5b and exchange coupling between the first pinned magnetic layer 5a and the first antiferromagnetic layer 4. Of course, the pinned magnetic layer 5 may have a single layer structure.

Each of the first and second pinned magnetic layers 5a and 5c comprises a ferromagnetic material, for example, a NiFe alloy, Co, a CoNiFe alloy, a CoFe alloy, a CoNi alloy, or the like. Particularly, each of the first and second pinned magnetic layers 5a and 5c preferably comprises a CoFe alloy or Co. Also, the first and second pinned magnetic layers 5a and 5c preferably comprises the same material. The nonmagnetic intermediate layer 5b comprises a nonmagnetic material, for example, at least one of Ru, Rh, Pd, Ir, Os, Re, Cr, Cu, Pt. and Au. Particularly, the nonmagnetic intermediate layer 5b preferably comprises Ru or Cu.

The nonmagnetic material layer 6 is a layer for preventing magnetic coupling between the pinned magnetic layer 5 and the free magnetic layer 11, and a sensing current mainly flows through the layer. The nonmagnetic material layer 6 comprises a nonmagnetic material having conductivity, such as Cu, Cr, Au, Ag, or the like, and particularly preferably comprises Cu.

The free magnetic layer 11 has a central portion (track width region) 11a in which magnetization can be rotated with an external magnetic field, and both side portions 11b provided on both sides of the central portion 11a in the track width direction. The free magnetic layer 11 is formed to have a larger magnetic moment (magnetic thickness) per unit area than that of the ferromagnetic layers 12. The magnitude of magnetic moment per unit area can be represented by a product of saturation magnetization $M_s$ and thickness t.

The nonmagnetic layer 13 has a central portion 13a positioned on the central portion 11a of the free magnetic layer 11, and both side portions 13b positioned on the respective both side portions 11b of the free magnetic layer 11, the ferromagnetic layers 12 being formed on the both side portions 13b. Both side portions 13b of the nonmagnetic layer 13 are formed to a thickness with which RKKY coupling energy produced between both side portions 11b of the free magnetic layer 11 and the ferromagnetic layers 12 is a first peak or second peak value for antiparallel alignment. Namely, both side portions 11b of the free magnetic layer 11 are coupled with the respective ferromagnetic layers 12 in antiparallel to each other through both side portions 13b of the nonmagnetic layer 13 so that the magnetization directions of the free magnetic layer 11 and each ferromagnetic layer 12 are antiparallel to each other. The nonmagnetic layer 13 may be composed of at least one of Ru, Rh, Pd, Ir, Os, Re, Cr, Cu, Pt, and Au, and particularly preferably Ru or Cu. Although, in this embodiment, the nonmagnetic layer 13 is formed over the entire surface of the free magnetic layer 11, the nonmagnetic layer 13 may be formed only on both side portions 11b of the free magnetic layer 11.

Each of the free magnetic layer 11 and the ferromagnetic layers 12 comprises a ferromagnetic material, for example, a NiFe alloy, Co, a CoNiFe alloy, a CoFe alloy, a CoNi alloy, or the like. The free magnetic layer 11 and the ferromagnetic layers 12 preferably comprise the same material. In the use of the same material, the thickness of each free ferromagnetic layer 12 is made smaller than that of the free magnetic layer 11 so that the magnetic moment per unit area of the free magnetic layer 11 is larger than that of the ferromagnetic layers 12. With the free magnetic layer 11 and the ferromagnetic layers 12 each having a single layer structure, the free magnetic layer 11 or the ferromagnetic layers 12, or both of the layers 11 and 12 preferably comprise a CoNiFe alloy. On the other hand, with the free magnetic layer 11 and the ferromagnetic layers 12 each having a multi-layer structure, the free magnetic layer 11 preferably comprises a laminate of a NiFe alloy and a CoFe alloy which are laminated in order, and each of the ferromagnetic layers 12 preferably comprises a laminate of a CoFe alloy and a NiFe alloy which are laminated in order.

The second antiferromagnetic layers 14 are formed on the respective ferromagnetic layers 12 to produce exchange coupling magnetic fields between the second antiferromagnetic layers 14 and the respective ferromagnetic layer 12 by a heat treatment, such that the magnetization direction of each ferromagnetic layer 12 is pinned in the track width direction (the rightward direction in FIG. 1). When magnetization of each ferromagnetic layer 12 is pinned, magnetizations of both side potions 11b of the free magnetic layer 11 are pinned in a direction (the leftward direction in FIG. 1; antiparallel) opposite to the magnetization direction of the ferromagnetic layers 12 through both side portions 13b of the nonmagnetic layer 13, and the magnetization direction of the central portion 11a between both side portions 11b is aligned in antiparallel to the ferromagnetic layers 12. In this embodiment, the track width Tw is regulated by the distance between the second antiferromagnetic layers 14 in the track width direction, and the track width Tw coincides with the dimension of the central portion 11a of the free magnetic layer 11 in the track width direction.

Like the first antiferromagnetic layer 4, each of the second antiferromagnetic layers 14 comprises a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy.

Each of the electrode layers 20 comprises a first electrode layer 21 formed on the first antiferromagnetic layer 4 to make contact with the end surfaces of the first antiferromagnetic layer 4, the pinned magnetic layer 5, the nonmagnetic material layer 6, the free magnetic layer 11 and each second antiferromagnetic layer 12 at each side in the track width direction, and a second electrode layer 22 formed on the first electrode layer 21 and each second antiferromagnetic layer 14. Each of the first and second electrode layers 21 and 22 comprises a conductive material having low resistivity, for example, Au, Cu, α-Ta, Cr, or the like. The sensing current supplied to the second electrode layers 22 flows into the nonmagnetic material layer 6, the free magnetic layer 11 and the pinned magnetic layer 5 through the respective first electrode layers 21.

Although not shown in the drawing, an upper shield layer is formed on the second electrode layers 22 and the central portion 13a of the nonmagnetic layer 13 through an upper gap layer composed of, for example, alumina.

The above-described GMR element 1 is characterized in that at least the free magnetic layer 11, the nonmagnetic layer 13 and the ferromagnetic layers 12 have continuous end surfaces α at both sides in the track width direction. In this way, when both ends are the continuous surfaces, magnetostatic coupling can be produced between the free magnetic layer 11 and each ferromagnetic layer 12 at both end surfaces, and thus a demagnetizing field applied to the free magnetic layer 11 in the track width direction thereof can be weakened by the magnetostatic coupling. Therefore, even when the dimension FW of the free magnetic layer 11 in the track width direction is decreased by narrowing the track, disturbance of magnetization at both end surfaces of the free magnetic layer and the ferromagnetic layer 12 and disturbance of magnetization within the track width region can be suppressed.

The GMR element 1 is also characterized in that the ratio (FW/FL) of the dimension FW of the free magnetic layer 11 in the track width direction to the dimension FL of the ferromagnetic layers 12 in the track width direction is 1.1 to 2.0. The dimension FL of the ferromagnetic layers 12 in the track width direction is a total dimension (FL1+FL2) of a pair of the ferromagnetic layers 12 shown in FIG. 1. With the ratio (FW/FL) within the above range, magnetizations of both side portions 11b of the free magnetic layer 11 can be appropriately pinned by antiparallel coupling with the ferromagnetic layers 12, and magnetization rotation in the central portion 11a of the free magnetic layer 11 can be facilitated with the external magnetic field. Therefore, a distortion and instability of the reproduction waveform can be suppressed to improve output sensitivity, and the occurrence of side reading can be prevented. The magnetization rotation in the central portion 11a of the free magnetic layer 11 is further facilitated by weakening RKKY antiparallel coupling between both side portions 11b of the free magnetic layer 11 and the ferromagnetic layers 12, thereby further improving the output sensitivity. The strength of antiparallel coupling between the ferromagnetic layers 12 and both side portions 11b of the free magnetic layer 11 can be controlled by controlling the thickness of both side portions 13b of the nonmagnetic layer 13.

The GMR element 1 is further characterized in that the electrode layers 20 are formed in contact with the tops of the respective second antiferromagnetic layers 14 and the end surfaces of the layers ranging from the second antiferromagnetic layers 14 to the pinned magnetic layer 5 at both sides in the track width direction, and thus the sensing current is supplied without passing through the second antiferromagnetic layers 14. When the sensing current is supplied without passing through the second antiferromagnetic layers 14, the element resistance can be decreased, as compared with a conventional element in which a sensing current is supplied through the second antiferromagnetic layers 14. As a result, the occurrence of high-frequency noise can be suppressed to improve the SN ratio.

Figure 2:
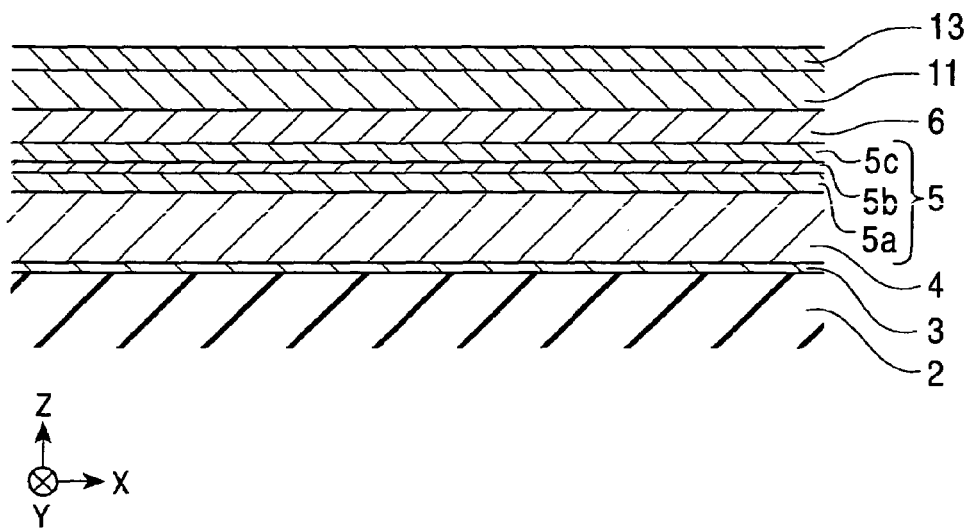
FIG. 2 is a drawing showing a step of a method of manufacturing the GMR element shown in FIG. 1.

The method of manufacturing the GMR element shown in FIG. 1 will be described with reference to FIGS. 2 to 8. First, the seed layer 3, the first antiferromagnetic layer 4, the fist pinned magnetic layer 5a, the nonmagnetic intermediate layer 5b and the second pinned magnetic layer 5c constituting the pinned magnetic layer 5, the nonmagnetic material layer 6, the free magnetic layer 11, and the nonmagnetic layer 13 are continuously deposited on the lower gap layer 2 composed of alumina (FIG. 2). This continuous deposition step is performed by a thin film forming process such as sputtering, evaporation, or the like in a same vacuum deposition apparatus.

The seed layer 3 comprises a NiFe alloy, a NiCr alloy, a NiFeCr alloy, Cr, or the like. The first antiferromagnetic layer 4 comprises a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy. With the first antiferromagnetic layer 4 comprising any one of these alloy materials, a large exchange coupling magnetic field can be produced in magnetic field annealing in a subsequent step.

Each of the first and second pinned magnetic layers 5a and 5c may comprise a magnetic material, for example, a NiFe alloy, Co, a CoNiFe alloy, a CoFe alloy, a CoNi alloy, or the like, and the first and second pinned magnetic layers 5a and 5b preferably comprise the same material. The nonmagnetic intermediate layer 5b may comprise any one of Ru, Rh, Pd, Ir, Os, Re, Cr, Cu, Pt. and Au, and particularly preferably comprises Ru or Cu. The pinned magnetic layer 5 may comprise a single ferromagnetic material layer.

The nonmagnetic material layer 6 may comprise a non-magnetic material having conductivity, for example, Cu, Cr, Au, Ag, or the like. Particularly, the nonmagnetic material layer 6 preferably comprises Cu. The free magnetic layer 11 may comprise any one of a NiFe alloy, Co, a CoFe alloy, a CoNi alloy, and a CoFeNi alloy. The nonmagnetic layer 13 may comprise any one of Ru, Rh, Pd, Ir, Os, Re, Cr, Cu, Pt, and Au, and particularly preferably comprises Ru or Cu. The nonmagnetic layer 13 is deposited to a thickness larger than that in the completed state shown in FIG. 1.

After the nonmagnetic layer 13 is deposited, a first heat treatment is performed. Namely, a heat treatment is performed at a first heat treatment temperature with a first magnetic field applied in a direction (height direction; the Y direction shown in the drawing) perpendicular to the track width direction to produce an exchange coupling magnetic field between the first antiferromagnetic layer 4 and the first pinned magnetic layer 5a, for pinning magnetization of the first pinned magnetic layer 5a in the height direction.

Figure 3:
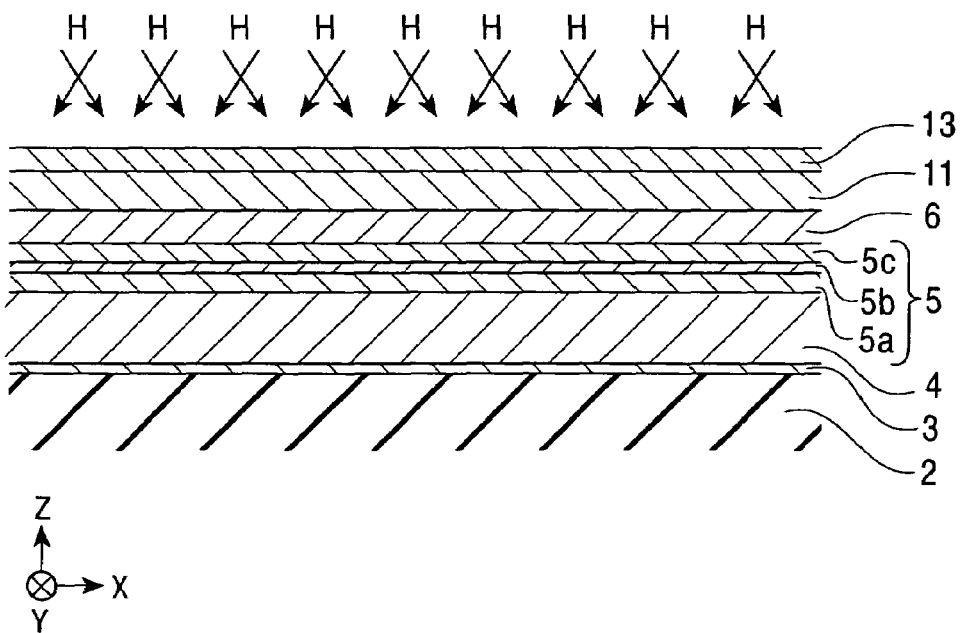
FIG. 3 is a drawing showing a step after the step shown in FIG. 2.

After the annealing treatment, as shown in FIG. 3, the surface of the nonmagnetic layer 13 is cleaned by low-energy ion milling. In this embodiment, low-energy ion milling is performed by using Ar ions accelerated with, for example, 100 to 200 eV. In this step, the nonmagnetic layer 13 is controlled to a thickness with which RKKY coupling energy produced between the free magnetic layer 11 and the ferromagnetic layer 12 through the nonmagnetic layer 13 is a first peak value (or second peak value) for antiparallel alignment. For example, when the nonmagnetic layer 13 is composed of Ru, the thickness is preferably controlled to 6 Å to 12 Å, while when the nonmagnetic layer 13 is composed of Cu, the thickness is preferably controlled to 7 Å to 12 Å. In FIG. 3, the ion milling direction is shown by arrows H.

Figure 4:
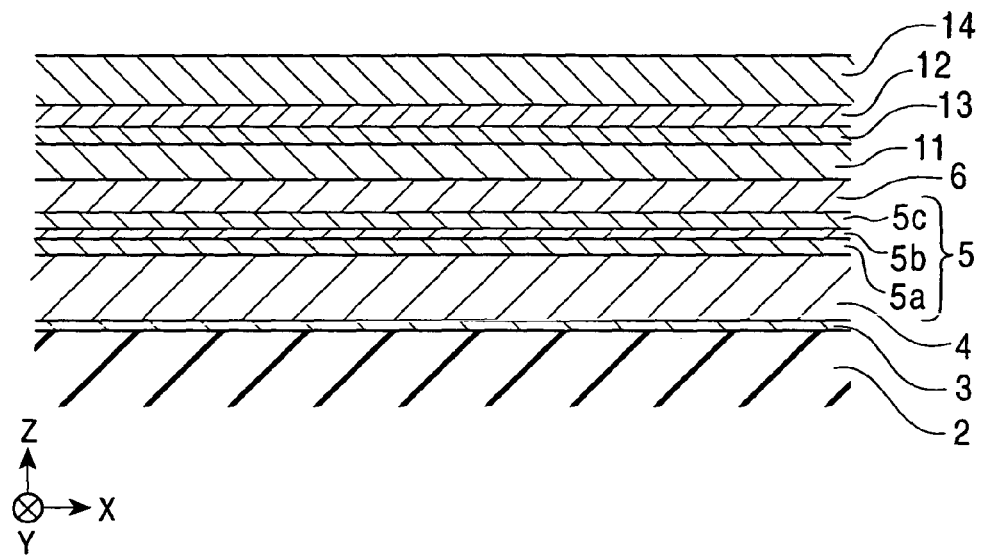
FIG. 4 is a drawing showing a step after the step shown in FIG. 3.

Next, as shown in FIG. 4, the ferromagnetic layer 12 and the second antiferromagnetic layer 14 are continuously deposited on the nonmagnetic layer 13 by sputtering or evaporation.

The ferromagnetic layer 12 preferably comprises the same material as the free magnetic layer 11. When the free magnetic layer 11 and the ferromagnetic layer 12 comprise the same material, the ferromagnetic layer 12 is formed to a smaller thickness than that of the free magnetic layer 11 so that the magnetic moment per unit area of the free magnetic layer 11 is larger than that of the ferromagnetic layer 12. Each of the free magnetic layer 11 and the ferromagnetic layer 12 may be formed in a single layer structure or multi-layer structure. With the free magnetic layer 11 and the ferromagnetic layer 12 each having a single layer structure, at least one of the free magnetic layer 11 and the ferromag-
netic layer 12 preferably comprises a CoNiFe alloy. On the other hand, with the free magnetic layer 11 and the ferromagnetic layer 12 each having a multi-layer structure, the free magnetic layer 11 preferably comprises a laminate of a NiFe alloy and a CoFe alloy which are laminated in order, and the ferromagnetic layer 12 preferably comprises a laminate of a CoFe alloy and a NiFe alloy which are laminated in order.

Figure 5:
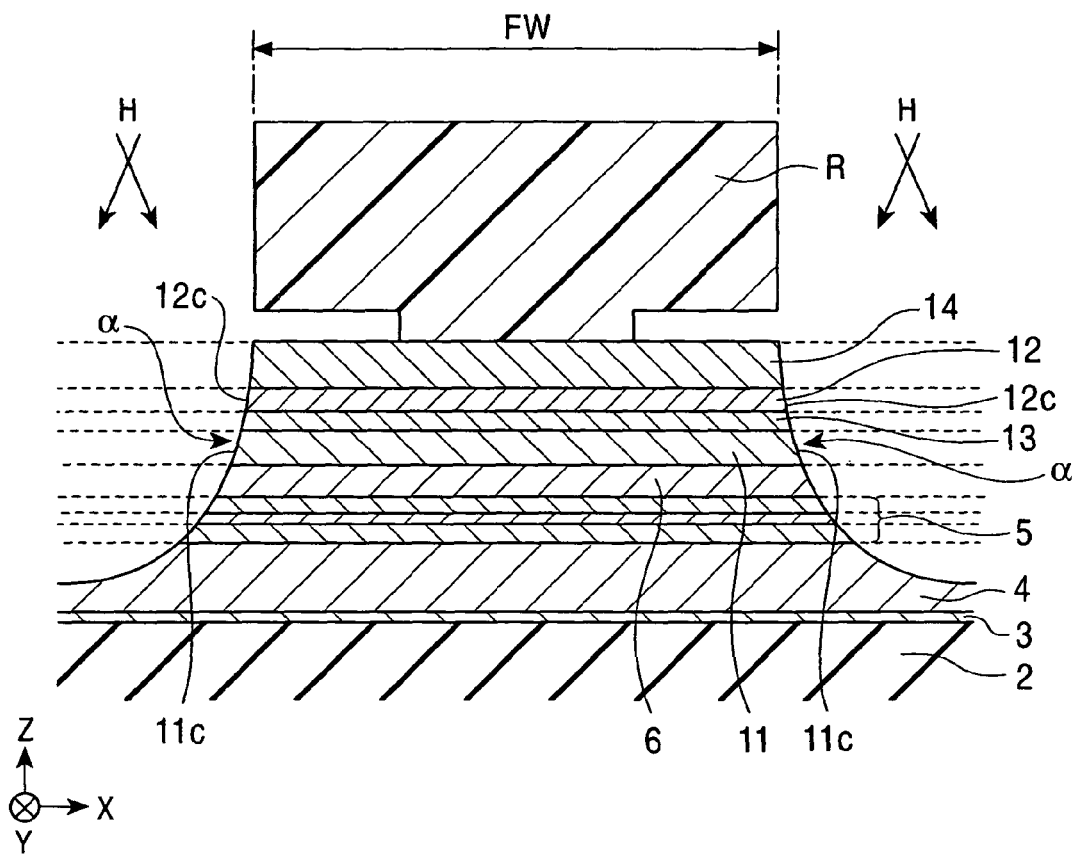
FIG. 5 is a drawing showing a step after the step shown in FIG. 4.

Then, a photoresist solution is coated on the second antiferromagnetic layer 14, and then patterned in the track width region by exposure and development to form a resist layer R shown in FIG. 5 at a position corresponding to the track width region. The resist layer R is a lift off resist layer. After the resist layer R is formed, ion milling is performed until the first antiferromagnetic layer 4 is exposed from both sides of the resist layer R in the track width direction (FIG. 5). In FIG. 5, the ion milling direction is shown by arrows H. The ion milling may be continued until the seed layer 3 or the lower gap layer 2 is exposed.

In the ion milling step, the portions shown by dotted lines in FIG. 5 out of the track width region (portions of the second antiferromagnetic layer 14, the ferromagnetic layer 12, the nonmagnetic layer 13, the free magnetic layer 11, the nonmagnetic material layer 6, the pinned magnetic layer 5 and the first antiferromagnetic layer 4) are removed. As a result, the dimension FW of the free magnetic layer 11 in the track width direction is regulated, and the layers ranging from the second antiferromagnetic layer 14 to the first antiferromagnetic layer 4 have the continuous end surfaces α at both sides in the track width direction. When the continuous end surfaces α are formed, magnetostatic coupling can be produced between the free magnetic layer 11 and the ferromagnetic layer 12 at both end surfaces 11c and 12c of the free magnetic layer 11 and the ferromagnetic layer 12, and thus the influence of a demagnetizing field in both side portions of the free magnetic layer 11 and the ferromagnetic layer 12 can be decreased by the magnetostatic coupling.

Figure 6:
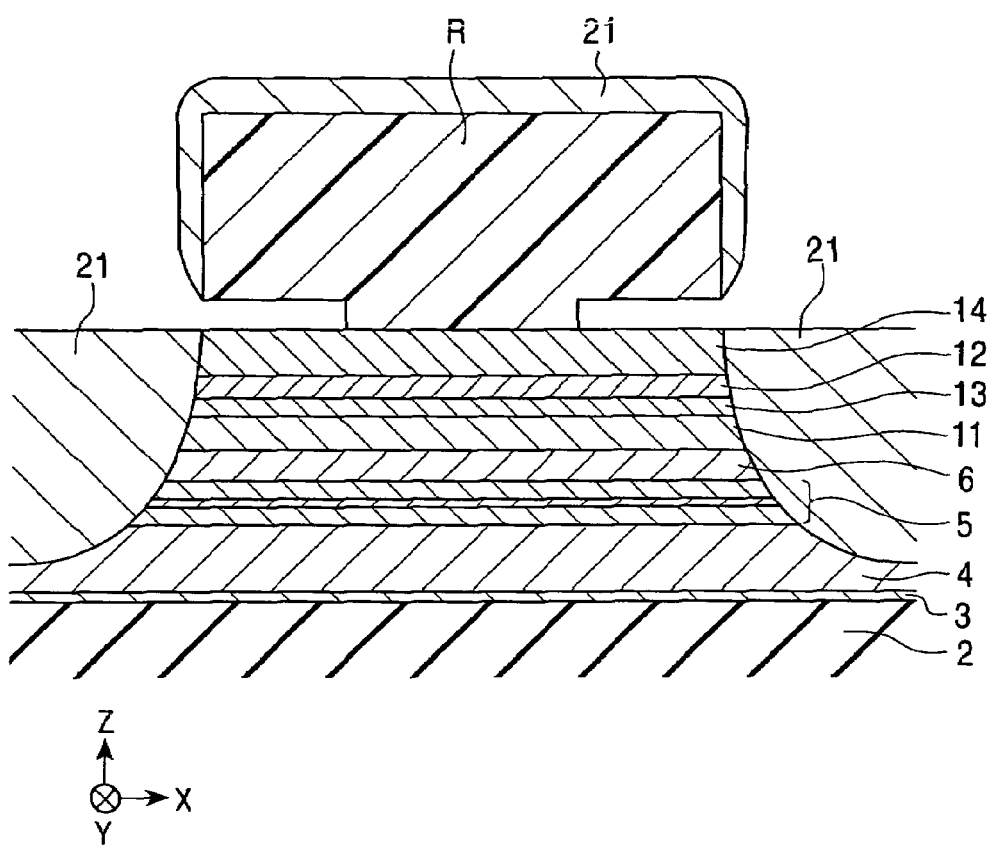
FIG. 6 is a drawing showing a step after the step shown in FIG. 5.

Then, as shown in FIG. 6, the first electrode layers 21 are formed on the first antiferromagnetic layer 4 to make contact with the end surfaces of the layers ranging from the second antiferromagnetic layer 14 to the first antiferromagnetic layer 4 at both sides in the track width direction. Each of the first electrode layers 21 may comprise a conductive material having low resistivity, for example, Au, Cu, α-Ta, Cr, or the like.

Figure 7:
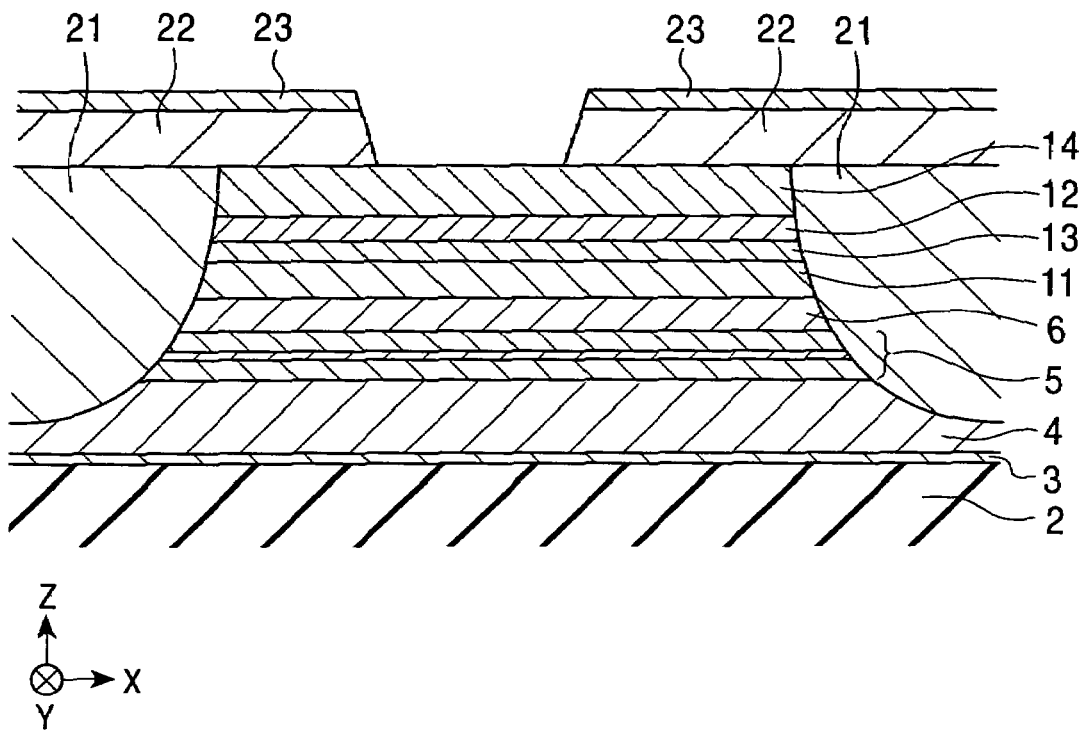
FIG. 7 is a drawing showing a step after the step shown in FIG. 6.

After the first electrode layers 21, the resist layer R is removed by liftoff, and the second electrode layers 22 are formed on the first electrode layers 21 and regions of the second antiferromagnetic layer 14 out of the track width region, as shown in FIG. 7. Namely, a second electrode layer 22 and metal mask layer 23 are formed on the first electrode layers 21 and the second antiferromagnetic layer 14, and then the metal mask layer 23 and the second electrode layer 22 are removed from the track width region by reactive ion etching. The second electrode layers 22 preferably comprise the same conductive material as that of the first electrode layers 21. The second electrode layers 22 can be formed by a liftoff method. In the liftoff method, the metal mask layers 23 need not be formed.

When the sensing current is supplied to the second electrode layers 22, the sensing current flows into the nonmagnetic material layer 6, the pinned magnetic layer 5 and the free magnetic layer 11 through the first electrode layers 21 having low resistivity. Namely, the sensing current can be supplied without passing through the second antiferromagnetic layer 14 having extremely higher resistivity than the electrode layers 20. Therefore, the element resistance of the GMR element 1 to be formed can be sufficiently suppressed to avoid a decrease in the SN ratio due to high-frequency noise.

Figure 8:
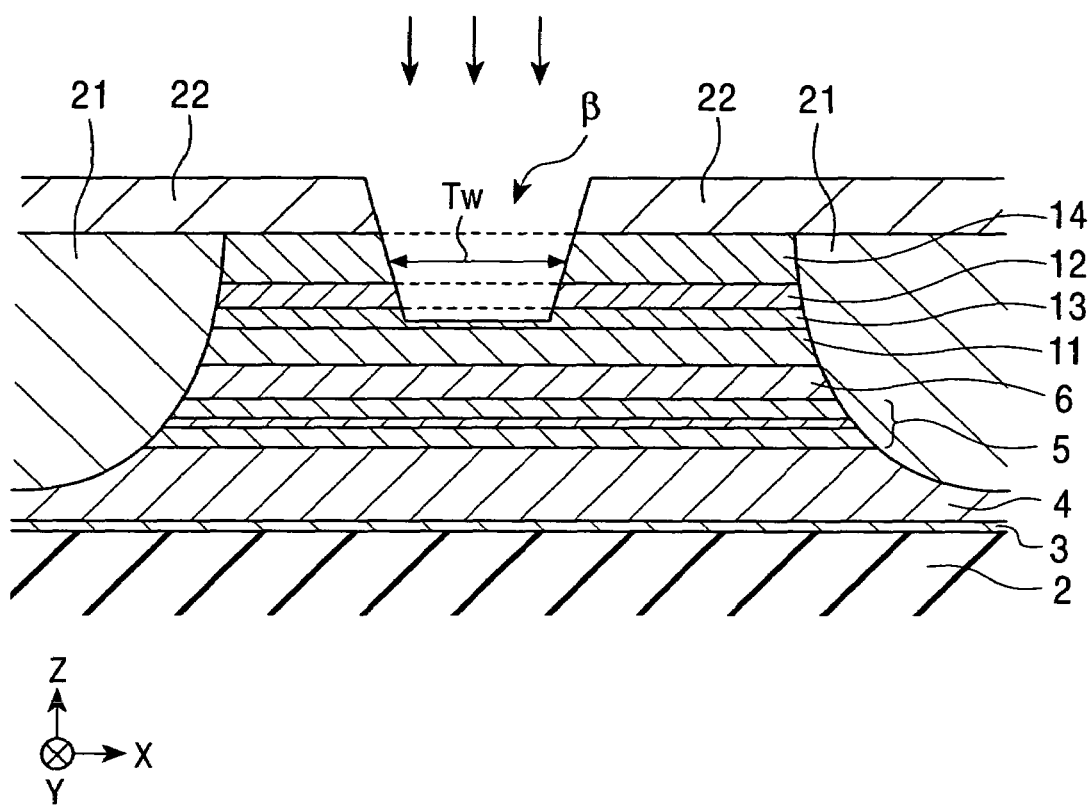
FIG. 8 is a drawing showing a step after the step shown in FIG. 7.

After the second electrode layers 22 are formed, as shown in FIG. 8, reactive ion etching (RIE) treatment is performed by using the metal mask layers 23 and the second electrode layers 22 as masks to remove the second antiferromagnetic layer 14, the ferromagnetic layer 12 and the nonmagnetic layer 13 from the track width region. In this embodiment, the reactive ion etching is stopped when the thickness of the nonmagnetic layer 13 (central portion 13a) in the track width region becomes 3 Å or less. The nonmagnetic layer 13 may be completely removed from the track width region, and ion milling may be performed in place of the reactive ion etching.

In the reactive ion etching step, the portions shown by dotted lines in FIG. 8 are moved to form a recess β. Namely, the ferromagnetic layer 12 and the second antiferromagnetic layer 14 are present only on both side portions 11b of the free magnetic layer 11. Therefore, the track width Tw is regulated by the distance between the second antiferromagnetic layers 14 in the track width direction, and the dimension FL of the ferromagnetic layers 12 in the track width direction is regulated.

In this embodiment, the ratio (FW/FL) of the dimension FW of the free magnetic layer 11 in the track width direction to the dimension FL of the ferromagnetic layers 12 in the track width direction is set to 1.1 to 2.0 so as to appropriately pin magnetization of each side portion 11b of the free magnetic layer 11 and facilitate magnetization rotation of the central portion 11a with the external magnetic field.

Then, a second heat treatment is performed. In this step, a heat treatment is performed at a second heat treatment temperature lower than the blocking temperature of the first antiferromagnetic layer 4 with a second magnetic field applied in a direction (track width direction) perpendicular to the first magnetic field, the second magnetic field being higher than the coercive force of the free magnetic layer 11 and the ferromagnetic layer 12 and lower than the flip flop magnetic field. In this heat treatment, an exchange coupling magnetic field is produced between the ferromagnetic layers 12 and the second antiferromagnetic layers 14 to pin the magnetization directions of the ferromagnetic layers 12 in a direction perpendicular to the magnetization direction of the pinned magnetic layer 5. The second heat treatment may be performed immediately after the step shown in FIG. 4. The GMR element shown in FIG. 1 is obtained by the above-described steps.

Figure 9:
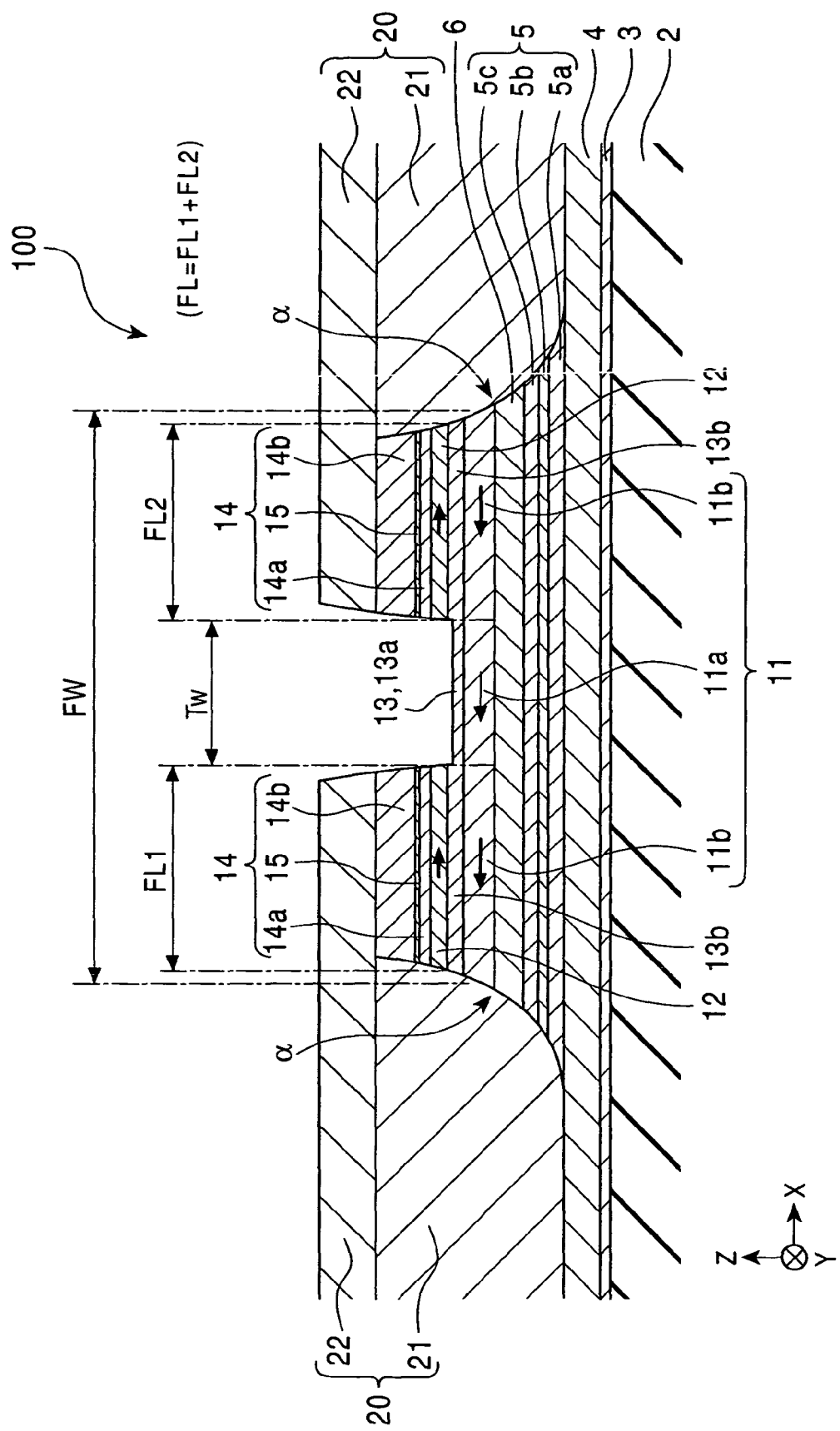
FIG. 9 is a partial sectional view showing the structure of a GMR element according to a second embodiment of the present invention, as viewed from a surface facing a recording medium.

FIG. 9 is a partial sectional view showing the structure of a GMR element 100 according to a second embodiment of the present invention, as viewed from a surface facing a recording medium. The second embodiment is different from the first embodiment in that each of the second antiferromagnetic layers 14 comprises a lower antiferromagnetic layer 14a and an upper antiferromagnetic layer 14b. In FIG. 9, substantially the same components as in the first embodiment are denoted by the same reference numerals.

A nonmagnetic protective layer 15 may be interposed between the lower antiferromagnetic layer 14a and the upper antiferromagnetic layer 14b. The nonmagnetic protective layer 15 is provided as an antioxidation layer for preventing oxidation of the lower antiferromagnetic layer 14a in the manufacturing process, and is formed to a thickness of 3 Å or less. The constituent elements of the nonmagnetic protective layer 5 may diffuse into the lower antiferromagnetic layer 14a and/or upper antiferromagnetic layer 14b in a heat treatment for producing the exchange coupling magnetic field between the ferromagnetic layer 12 and the lower antiferromagnetic layer 14a, and may be mixed in the lower antiferromagnetic layer 14a and/or upper antiferromagnetic layer 14b.

The upper antiferromagnetic layer 14b is coupled with the lower antiferromagnetic layer 14a through the nonmagnetic protective layer 15 to function integrally with the lower antiferromagnetic layer 14a. The lower antiferromagnetic layer 14a is preferably formed to a thickness of 20 Å to 50 Å so as not to assume the antiferromagnetic properties in the stage in which only the lower antiferromagnetic layer 14a is deposited. Also, the total thickness of the lower antiferromagnetic layer 14 and the upper antiferromagnetic layer 14b is preferably 80 Å to 300 Å so as to produce a large exchange coupling magnetic field between the ferromagnetic layer 12 and the lower antiferromagnetic layer 14a by a heat treatment.

The lower antiferromagnetic layer 14a and the upper antiferromagnetic layer 14b preferably comprise the same material such as a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy. On the other hand, the nonmagnetic protective layer 15 may comprise at least one of Ru, Rh, Pd, Ir, Os, Re, Cr, Cu, Pt, and Au, and particularly preferably comprises Ru or Cr. In the combination of the material for the lower antiferromagnetic layer 14a and the upper antiferromagnetic layer 14b and the material for the nonmagnetic protective layer 15, the lower and upper antiferromagnetic layers 14a and 14b integrally function to produce a large exchange coupling magnetic field between the ferromagnetic layer 12 and these antiferromagnetic layers 14a and/or 14b even when the constituent elements of the nonmagnetic protective layer 15 diffuse into the lower antiferromagnetic layer 14a and/or the upper antiferromagnetic layer 14b to increase the concentration of the elements of the nonmagnetic protective layer 15 near the interface between the lower antiferromagnetic layer 14a and/or the upper antiferromagnetic layer 14b.

Figure 10:
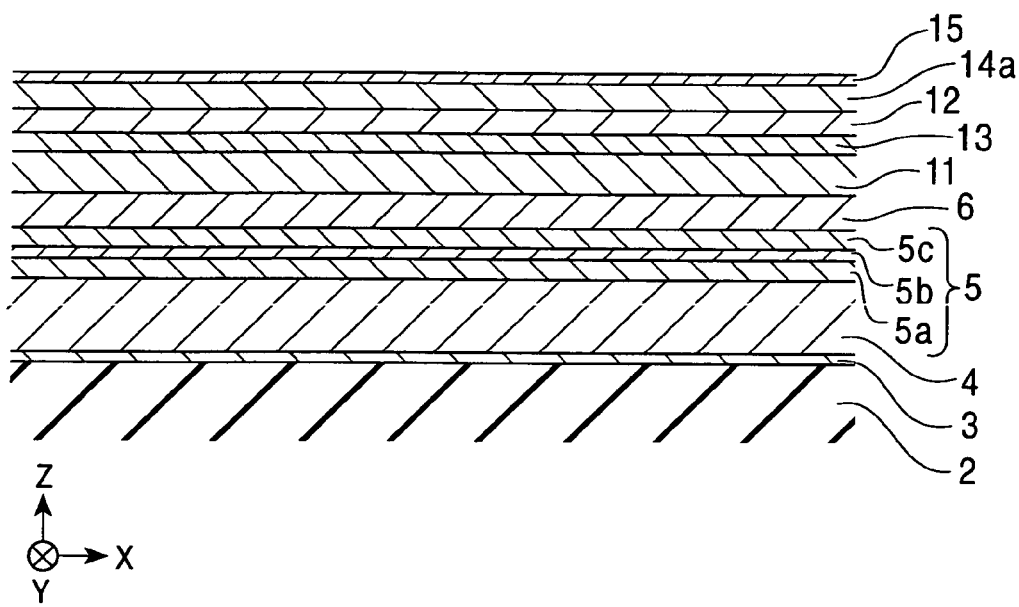
FIG. 10 is a drawing showing a step of a method of manufacturing the GMR element shown in FIG. 9.

The method of manufacturing the GMR element 100 shown in FIG. 9 will be described below with reference to FIGS. 10 to 13. First, the seed layer 3, the first antiferromagnetic layer 4, the first pinned magnetic layer 5a, the nonmagnetic intermediate layer 5b and the second pinned magnetic layer 5c constituting the pinned magnetic layer 5, the nonmagnetic material layer 6, the free magnetic layer 11, the nonmagnetic layer 13, the ferromagnetic layer 12, the lower antiferromagnetic layer 14a and the nonmagnetic protective layer 15 are continuously deposited on the lower gap layer 2 composed of alumina (FIG. 10). This continuous deposition step is performed by a thin film forming process such as sputtering, evaporation, or the like in a same vacuum deposition apparatus.

Since the materials and thicknesses of the seed layer 3, the first antiferromagnetic layer 4, the first pinned magnetic layer 5a, the nonmagnetic intermediate layer 5b, the second pinned magnetic layer 5c, the nonmagnetic material layer 6, the free magnetic layer 11, the nonmagnetic layer 13 and the ferromagnetic layer 12 are the same as those in the first embodiment, the description of these layers is omitted.

Like the first antiferromagnetic layer 4, the lower antiferromagnetic layer 14a comprise a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy. The lower antiferromagnetic layer 14a is preferably formed to a thickness of 20 Å to 50 Å. With a thickness in this range, in a stage in which only the lower antiferromagnetic layer 14a is formed on the ferromagnetic layer 12, a heat treatment produces no (or a weak) exchange coupling magnetic field occurs between the ferromagnetic layer 12 and the lower antiferromagnetic layer 14a.

The nonmagnetic protective layer 15 is provided as a protective layer (antioxidation layer) for preventing oxidation of the lower antiferromagnetic layer 14a, and is preferably formed to a thickness of 3 Å to 10 Å. The nonmagnetic protective layer 15 may comprise at least one of Ru, Rh, Pd, Ir, Os, Re, Cr, Cu, Pt, and Au, and particularly preferably comprises Ru or Cr.

After the nonmagnetic protective layer 15 is formed, a first heat treatment is performed. Namely, a heat treatment is performed at a first heat treatment temperature with a first magnetic field applied in a direction (height direction; the Y direction shown in the drawing) perpendicular to the track width Tw to produce an exchange coupling magnetic field between the first antiferromagnetic layer 4 and the first pinned magnetic layer 5a, for pinning magnetization of the first pinned magnetic layer 5a. In this step, the lower antiferromagnetic layer 14a is less ordered by the first heat treatment because it has a small thickness so as not to assume the antiferromagnetic properties, as described above, thereby producing no (or a weak) exchange coupling magnetic field between the lower antiferromagnetic layer 14a and the ferromagnetic layer 12.

Figure 11:
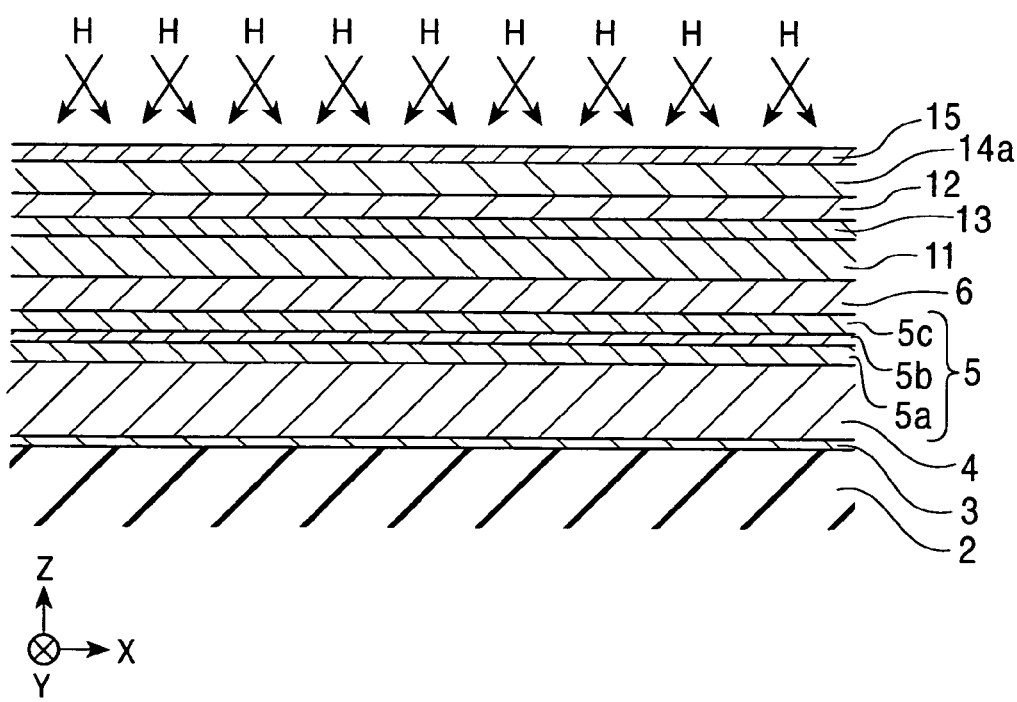
FIG. 11 is a drawing showing a step after the step shown in FIG. 10.

Then, as shown in FIG. 11, the surface of the nonmagnetic protective layer 15 is cleaned by low-energy ion milling. In this step, the nonmagnetic protective layer 15 is controlled to a thickness of 3 Å or less.

Figure 12:
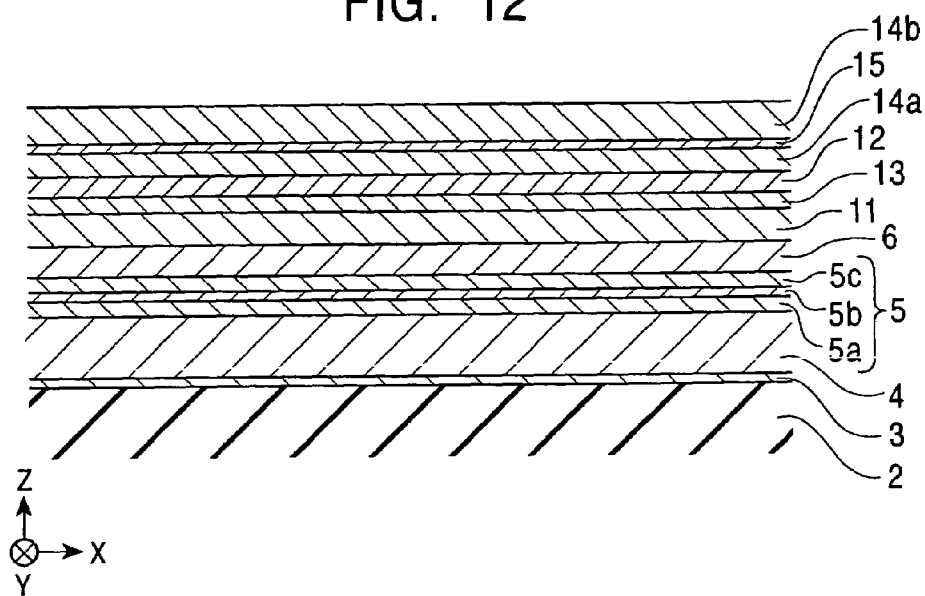
FIG. 12 is a drawing showing a step after the step shown in FIG. 11.

Next, as shown in FIG. 12, the upper antiferromagnetic layer 14b is formed on the lower antiferromagnetic layer 14a with the nonmagnetic protective layer 15 provided therebetween. The upper antiferromagnetic layer 14b is preferably formed so that the total thickness of the upper antiferromagnetic and lower antiferromagnetic layers 14b and 14a is 80 Å to 300 Å. With a total thickness in this range, the lower antiferromagnetic layer 14a and upper antiferromagnetic layer 14b can integrally function as the second antiferromagnetic layer 14 to produce a large exchange coupling magnetic field between the lower antiferromagnetic layer 14a and the ferromagnetic layer 12 by the heat treatment. When the nonmagnetic protective layer 15 is completely removed by the low-energy ion milling step shown in FIG. 11, the upper antiferromagnetic layer 14b is formed directly on the lower antiferromagnetic layer 14a.

Figure 13:
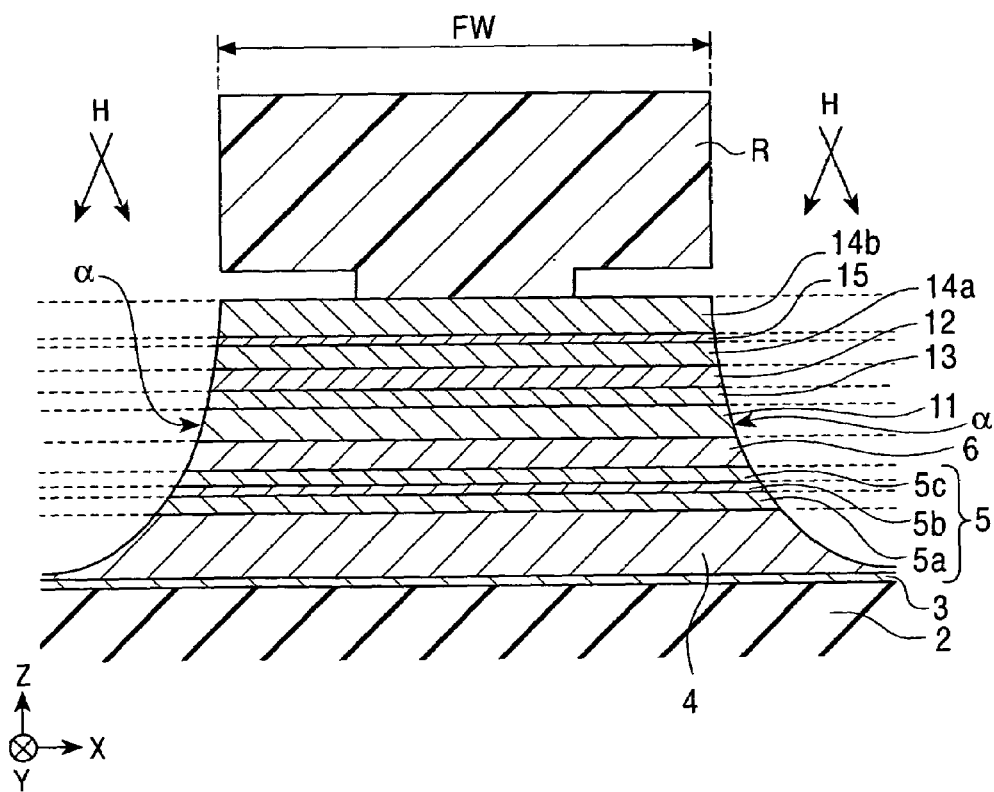
FIG. 13 is a drawing showing a step after the step shown in FIG. 12.

After the upper antiferromagnetic layer 14b is formed, as shown in FIG. 13, a photoresist layer R is formed on the upper antiferromagnetic layer 14b, and then ion milling is performed until the first antiferromagnetic layer 14 is exposed from both sides of the resist layer R in the track width direction (FIG. 13). In FIG. 13, the ion milling direction is shown by arrows H. In the ion milling step, portions of each layer shown by dotted lines in FIG. 13 out of the track width region are removed. As a result, the dimension FW of the free magnetic layer 11 in the track width direction is regulated, and the layers ranging from the upper antiferromagnetic layer 14b to the first antiferromagnetic layer 4 have the continuous end surfaces a at both sides in the track width direction, thereby producing magnetostatic coupling between the free magnetic layer 11 and the ferromagnetic layer 12 at both side end surfaces 11c and 12c. The ion milling may be performed until the seed layer 3 or the lower gap layer 2 is exposed.

Then, the first and second electrode layers 21 and 22 are formed, and then the upper antiferromagnetic layer 14b, the nonmagnetic protective layer 15, the lower antiferromagnetic layer 14a, the ferromagnetic layer 12 and the non magnetic layer 13 are removed from the track width region by the same steps as those (FIG. 6 to 8) in the first embodiment. As a result, the track width Tw is regulated by the distance between the upper antiferromagnetic layers 14b, the nonmagnetic protective layers 15 and the lower antiferromagnetic layers 14a, and the dimension FL of the ferromagnetic layers 12 in the track width direction is regulated.

Then, a second heat treatment is performed. In this step, a heat treatment is performed at a second heat treatment temperature lower than the blocking temperature of the first antiferromagnetic layer 4 with a second magnetic field applied in a direction (track width direction) perpendicular to the first magnetic field. In this heat treatment, the constituent element of the nonmagnetic protective layer 15 may diffuse into the lower antiferromagnetic layer 14a and/or upper antiferromagnetic layer 14b, and may be mixed in the lower antiferromagnetic layer 14a and/or upper antiferromagnetic layer 14b. This second heat treatment may be performed immediately after the step shown in FIG. 12. The GMR 100 shown in FIG. 9 is obtained by the above-described steps.

Figure 14:
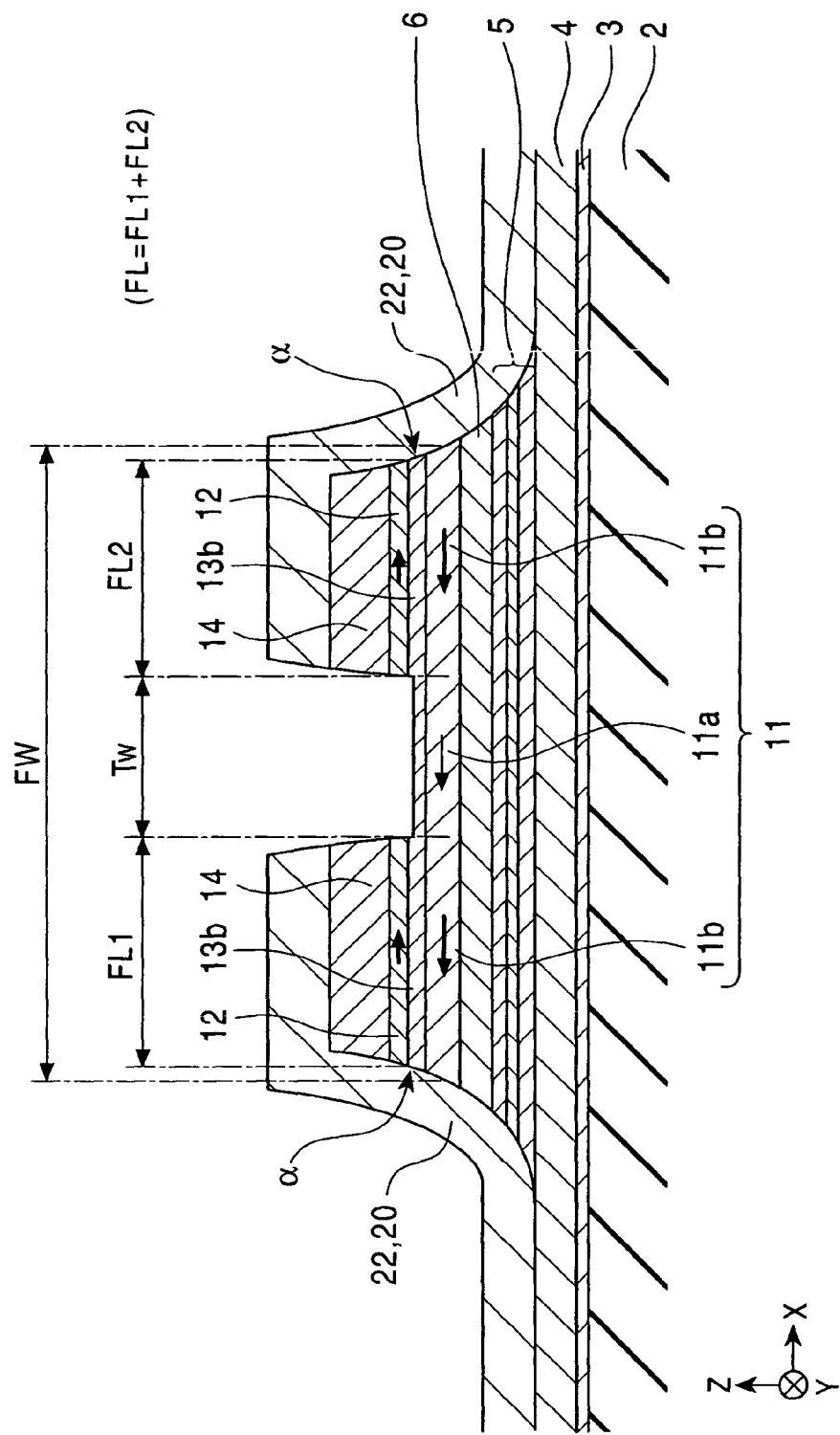
FIG. 14 is a partial sectional view showing a second electrode layer according to another embodiment.
Figure 15:
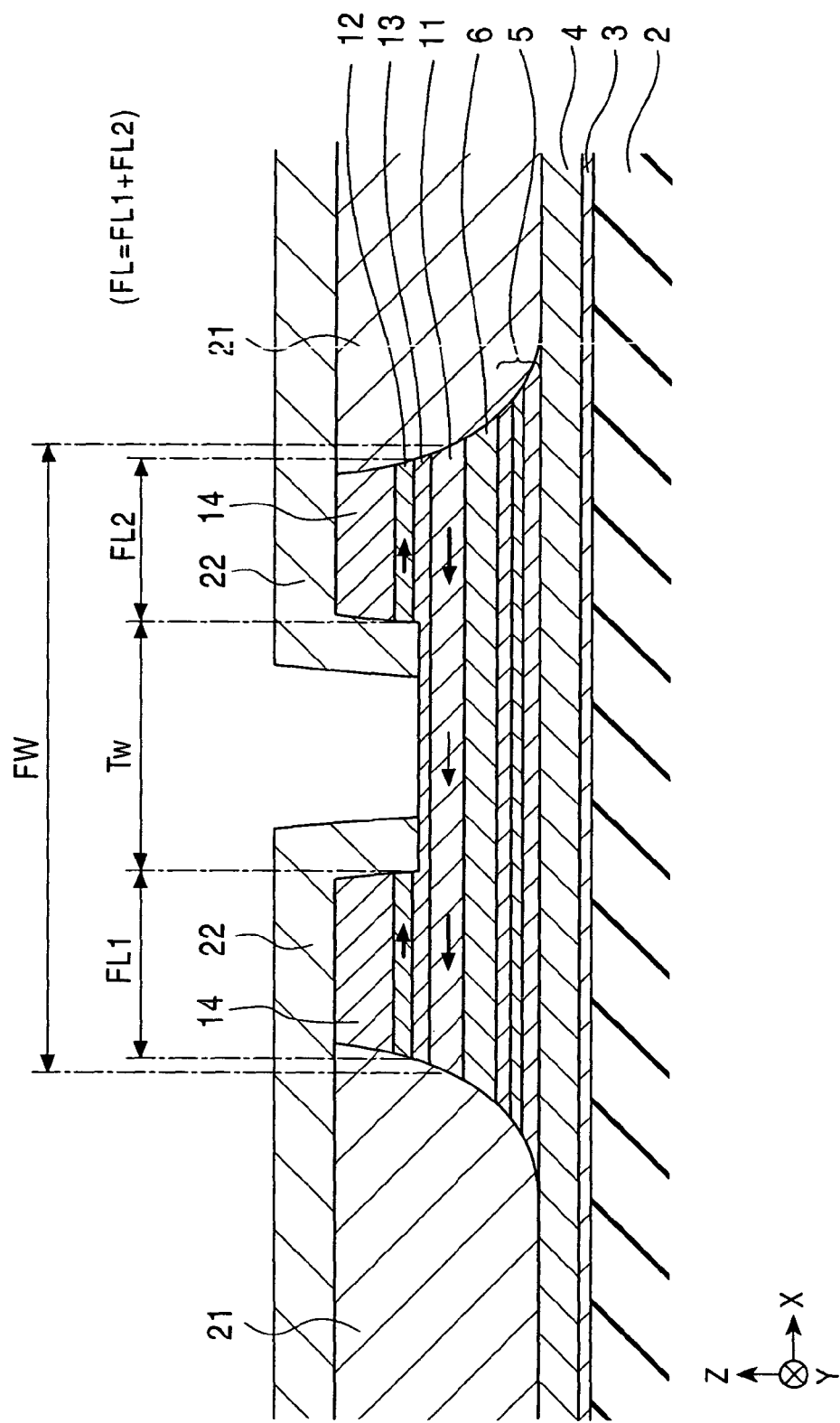
FIG. 15 is a partial sectional view showing a second electrode layer according to a further embodiment.

Although, in each of the above embodiments, the electrode layer 20 comprises the first and second electrode layers 21 and 22, the electrode layer 20 may have a single layer structure. Namely, only the first electrode layer 21 or the second electrode layer 22 may be formed. When only the second electrode layer 22 is formed, the resist layer R is removed after the continuous end surfaces a are formed in the step shown in FIG. 5 or 13, and then the second electrode layer 22 is formed on regions of the second antiferromagnetic layer 14 out of the track width region and on the continuous end surfaces α, as shown in FIG. 14. In any one of the cases, the sensing current can be supplied without passing through the second antiferromagnetic layers 14 to sufficiently suppress the element resistance. The electrode layer 20 (second electrode layer 22) may be formed to have ends overlaid on the free magnetic layer 11. In this overlaid structure, the element resistance can be further decreased, and the occurrence of side reading can be sufficiently prevented.

Although, in each of the above embodiments, the thickness of both side portions 13b of the nonmagnetic layer 13 is controlled to appropriately decrease antiparallel coupling between the free magnetic layer 11 and the ferromagnetic layer 12, thereby facilitating rotation in the central portion 11a of the free magnetic layer 11 and improving the output sensitivity. Since magnetostatic coupling occurs between the free magnetic layer 11 and the ferromagnetic layer 12 at both end surfaces in the track width direction, the occurrence of side reading can be sufficiently prevented even when antiparallel coupling between the free magnetic layer 11 and the ferromagnetic layer 12 is weakened.

The above-described GMR element (100) of the present invention can be applied not only to a reproducing thin film magnetic head but also to a recording/reproducing thin film magnetic head comprising the reproducing thin film magnetic head and a recording inductive head laminated thereon. The GMR element can also be used as any one of various magnetic sensors.

In the present invention, at least a free magnetic layer, a non-magnetic layer and a ferromagnetic layer are formed to have continuous end surfaces at both sides in the track width direction, and thus magnetostatic coupling occurs between the free magnetic layer and the ferromagnetic layer at both end surfaces. Therefore, the influence of a demagnetizing field applied to the free magnetic layer and the ferromagnetic layer can be decreased by the magnetostatic coupling. Thus, even when the dimension of the free magnetic layer in the track width direction is decreased for realizing a narrower track, a disturbance of magnetization within the track width region can be suppressed to improve output sensitivity. Also, in the present invention, the ratio (FW/FL) of the dimension of the free magnetic layer to the dimension of the ferromagnetic layer in the track width direction is regulated to 1.1 to 2.0, and thus the output sensitivity can be improved while sufficiently suppressing a distortion and instability of a reproduction waveform. Furthermore, in the present invention, the sensing current is supplied without passing through a second antiferromagnetic layer having high resistivity, and thus the element resistance can be sufficiently decreased, thereby suppressing high-frequency noise and improving the SN ratio.

What is claimed is:

1. A giant magnetoresistive element comprising:
   a first antiferromagnetic layer;
   a pinned magnetic layer formed on the first antiferromagnetic layer such that a magnetization direction is pinned by an exchange coupling magnetic field with the first antiferromagnetic layer;
   a nonmagnetic material layer formed on the pinned magnetic layer;
   a free magnetic layer formed on the nonmagnetic material layer such that a magnetization direction of a central portion changes with an external magnetic field;
   nonmagnetic layers formed on both side portions of the free magnetic layer in a track width direction;
   ferromagnetic layers formed on the respective nonmagnetic layers; and
   second antiferromagnetic layers formed on the respective ferromagnetic layers to align a magnetization direction of each ferromagnetic layer in a direction perpendicular to the magnetization direction of the pinned magnetic layer;
   wherein at least the free magnetic layer, the nonmagnetic layers and the ferromagnetic layers have continuous end surfaces at both sides in the track width direction, and
   electrode layers are formed in contact with upper surfaces of the respective second antiferromagnetic layers and contact with end surfaces of the layers ranging from the antiferromagnetic layers to the pinned magnetic layer at both sides in the track width direction.

2. A giant magnetoresistive element according to claim 1, wherein a ratio (FW/FL) of a dimension FW of the free magnetic layer to a dimension FL of the ferromagnetic layers in the track width direction is 1.1 to 2.0.

3. A giant magnetoresistive element according to claim 1, wherein each of the second antiferromagnetic layers comprises a lower antiferromagnetic layer laminated on each ferromagnetic layer, and an upper antiferromagnetic layer, each of the lower antiferromagnetic layers having a thickness of 20 Å to 50 Å.

4. A giant magnetoresistive element according to claim 3, wherein a total thickness of each lower antiferromagnetic layer and upper antiferromagnetic layer is 80 Å to 300 Å.

5. A giant magnetoresistive element according to claim 3, further comprising nonmagnetic protective layers interposed between the lower antiferromagnetic and upper antiferromagnetic layers, each of the nonmagnetic protective layers having a thickness of 3 Å or less.

6. A giant magnetoresistive element according to claim 5, wherein a constituent element of the nonmagnetic protective layers is mixed in the upper or lower antiferromagnetic layers.

7. A giant magnetoresistive element according to claim 5, wherein a constituent element of the nonmagnetic protective layers is at least one of Ru, Rh, Pd, Ir, Os, Re, Cr, Cu, Pt, or Au.

8. A giant magnetoresistive element according to claim 1, wherein each of the free magnetic layer and the ferromagnetic layers comprises at least one of a NiFe alloy, Co, a CoFe alloy, a CoNi alloy, or a CoFeNi alloy.

9. A giant magnetoresistive element according to claim 1, wherein the free magnetic layer and ferromagnetic layers are made of the same magnetic material, and a thickness of the ferromagnetic layers is smaller than that of the free magnetic layer.

10. A giant magnetoresistive element according to claim 1, wherein each of the free magnetic layer and ferromagnetic layers comprises a single layer, and at least one of the free magnetic layer or ferromagnetic layers comprise a CoFeNi alloy.

11. A giant magnetoresistive element according to claim 1, wherein the free magnetic layer comprises a laminate of a NiFe alloy layer and a CoFe alloy layer, and each of the ferromagnetic layers comprises a laminate of a CoFe alloy layer and a NiFe alloy layer.

12. A giant magnetoresistive element according to claim 1, wherein each of the nonmagnetic layers is composed of at least one of Ru, Rh, Pd, Ir, Os, Re, Cr, Cu, Pt, or Au.

13. A giant magnetoresistive element according to claim 1, wherein each of at least one of the first antiferromagnetic or second antiferromagnetic layers comprises at least one of a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy.

14. A giant magnetoresistive element comprising:
   a first antiferromagnetic layer;
   a pinned magnetic layer formed on the first antiferromagnetic layer such that a magnetization direction is pinned by an exchange coupling magnetic field with the first antiferromagnetic layer;
   a nonmagnetic material layer formed on the pinned magnetic layer;
   a free magnetic layer formed on the nonmagnetic material layer such that a magnetization direction of a central portion changes with an external magnetic field;
   nonmagnetic layers formed on both side portions of the free magnetic layer in a track width direction;
   ferromagnetic layers formed on the respective nonmagnetic layers; and
   second antiferromagnetic layers formed on the respective ferromagnetic layers to align a magnetization direction of each ferromagnetic layer in a direction perpendicular to the magnetization direction of the pinned magnetic layer;
   wherein at least the free magnetic layer, the nonmagnetic layers and the ferromagnetic layers have continuous end surfaces at both sides in the track width direction,
   electrode layers are formed in contact with upper surfaces of the respective second antiferromagnetic layers and contact with end surfaces of the layers ranging from the antiferromagnetic layers to the pinned magnetic layer at both sides in the track width direction, and
   each of the electrode layers comprises a first electrode layer formed in contact with the end surfaces of the layers ranging from the pinned magnetic layer to each second antiferromagnetic layer at each side in the track width direction, and a second electrode layer formed on the first electrode layer and each second antiferromagnetic layer.

15. A giant magnetoresistive element according to claim 14, wherein a ratio (FW/FL) of a dimension FW of the free magnetic layer to a dimension FL of the ferromagnetic layers in the track width direction is 1.1 to 2.0.

16. A giant magnetoresistive element according to claim 14, wherein each of the second antiferromagnetic layers comprises a lower antiferromagnetic layer laminated on each ferromagnetic layer, and an upper antiferromagnetic layer, each of the lower antiferromagnetic layers having a thickness of 20 Å to 50 Å.

17. A giant magnetoresistive element according to claim 16, wherein a total thickness of each lower antiferromagnetic layer and upper antiferromagnetic layer is 80 Å to 300 Å.

18. A giant magnetoresistive element according to claim 16, further comprising nonmagnetic protective layers interposed between the lower antiferromagnetic and upper antiferromagnetic layers, each of the nonmagnetic protective layers having a thickness of 3 Å or less.

19. A giant magnetoresistive element according to claim 18, wherein a constituent element of the nonmagnetic protective layers is mixed in the upper or lower antiferromagnetic layers.

20. A giant magnetoresistive element according to claim 18, wherein a constituent element of the nonmagnetic protective layers is at least one of Ru, Rh, Pd, Ir, Os, Re, Cr, Cu, Pt, or Au.

21. A giant magnetoresistive element according to claim 14, wherein each of the free magnetic layer and the ferromagnetic layers comprises at least one of a NiFe alloy, Co, a CoFe alloy, a CoNi alloy, or a CoFeNi alloy.

22. A giant magnetoresistive element according to claim 14, wherein the free magnetic layer and ferromagnetic layers are made of the same magnetic material, and a thickness of the ferromagnetic layers is smaller than that of the free magnetic layer.

23. A giant magnetoresistive element according to claim 14, wherein each of the free magnetic layer and ferromagnetic layers comprises a single layer, and at least one of the free magnetic layer or ferromagnetic layers comprise a CoFeNi alloy.

24. A giant magnetoresistive element according to claim 14, wherein the free magnetic layer comprises a laminate of a NiFe alloy layer and a CoFe alloy layer, and each of the ferromagnetic layers comprises a laminate of a CoFe alloy layer and a NiFe alloy layer.

25. A giant magnetoresistive element according to claim 14, wherein each of the nonmagnetic layers is composed of at least one of Ru, Rh, Pd, Ir, Os, Re, Cr, Cu, Pt, or Au.

26. A giant magnetoresistive element according to claim 14, wherein each of at least one of the first antiferromagnetic or second antiferromagnetic layers comprises at least one of a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy.

* * * * *